United States Patent
Wilson et al.

(10) Patent No.: US 10,154,610 B2
(45) Date of Patent: Dec. 11, 2018

(54) APPARATUS FOR DISTRIBUTING POWER

(71) Applicant: PCE, Inc., Lincoln, NE (US)

(72) Inventors: Brad Wilson, Lincoln, NE (US); Chad Wells, Lincoln, NE (US); Jesse Preuss, Lincoln, NE (US); James Darrin Schroeder, San Antonio, TX (US)

(73) Assignee: Vertiv Corporation, Worthington, OH (US)

( * ) Notice: Subject to any disclaimer, the term of this patent is extended or adjusted under 35 U.S.C. 154(b) by 215 days.

(21) Appl. No.: 14/705,739

(22) Filed: May 6, 2015

(65) Prior Publication Data

US 2015/0325967 A1    Nov. 12, 2015

Related U.S. Application Data

(60) Provisional application No. 61/989,083, filed on May 6, 2014.

(51) Int. Cl.
 *H05K 7/14*      (2006.01)
 *H01R 25/00*     (2006.01)
 *G06F 1/26*      (2006.01)

(52) U.S. Cl.
 CPC .......... *H05K 7/1492* (2013.01); *G06F 1/266* (2013.01); *H01R 25/006* (2013.01); *G06F 2200/261* (2013.01); *H01R 25/003* (2013.01); *Y02D 10/175* (2018.01); *Y10T 307/406* (2015.04)

(58) Field of Classification Search
 CPC .......................... H05K 7/1492; Y10T 307/406
 USPC .............................................. 307/31
 See application file for complete search history.

(56) References Cited

U.S. PATENT DOCUMENTS

| | | | |
|---|---|---|---|
| 5,214,314 A * | 5/1993 | Dillard | H01R 25/14 307/147 |
| 6,628,009 B1 | 9/2003 | Chapel | |
| 6,882,530 B2 * | 4/2005 | Cyphers | H05K 7/1457 361/600 |
| 7,619,868 B2 | 11/2009 | Spitaels et al. | |
| 7,841,878 B2 | 11/2010 | Johnson et al. | |
| 7,891,993 B2 | 2/2011 | Huber et al. | |
| 8,039,997 B2 | 10/2011 | Slessman | |
| 8,207,627 B2 | 6/2012 | Aldag et al. | |
| 8,503,149 B2 | 8/2013 | Spitaels et al. | |
| 8,622,756 B2 | 1/2014 | Smed | |
| 8,708,736 B2 | 4/2014 | Bailey et al. | |

(Continued)

FOREIGN PATENT DOCUMENTS

| EP | 1835793 A2 | 9/2007 |
|---|---|---|
| WO | 2008036848 A2 | 3/2008 |
| WO | 2012096677 A1 | 7/2012 |

*Primary Examiner* — Alfonso Perez Borroto
(74) *Attorney, Agent, or Firm* — Suiter Swantz pc llo

(57) ABSTRACT

The present disclosure is an apparatus for distributing power which includes a power configuration device and an outlet power strip. The power configuration device may be coupled to the outlet power strip via a cable, the cable including a connector device. The apparatus for distributing power may provide that the power configuration device may only be changed when necessary and the outlet power strip may only be changed when necessary, creating a modular power system for computer and data storage equipment which may allow for efficient and cost-effective power distribution modifications.

17 Claims, 17 Drawing Sheets

(56) References Cited

U.S. PATENT DOCUMENTS

| | | | |
|---|---|---|---|
| 8,902,569 B1* | 12/2014 | Wishman | G06F 1/26 |
| | | | 307/87 |
| 2004/0190241 A1 | 9/2004 | Cyphers et al. | |
| 2005/0130476 A1* | 6/2005 | Kochanski | H02G 3/00 |
| | | | 439/215 |
| 2005/0170678 A1 | 8/2005 | Donahue, IV | |
| 2006/0259538 A1 | 11/2006 | Ewing et al. | |
| 2007/0046103 A1* | 3/2007 | Belady | H02G 3/00 |
| | | | 307/12 |
| 2007/0291433 A1 | 12/2007 | Ziegler et al. | |
| 2010/0041277 A1 | 2/2010 | Huber et al. | |
| 2012/0295483 A1 | 11/2012 | Smed | |

* cited by examiner

| HOST BOX CONFIGURATION | NUMBER OF HOST BOX INPUTS | POWER AVAILABLE | POWER PER OUTLET GROUP |
| --- | --- | --- | --- |
| 30/32A 230/400V 3ØY | 1 | 16.5 kW (30A) 17.6 kW (32A) | 2.75 kW (30A) 2.93 kW (32A) |
| 16A 230/400V 3ØY | 2 | 17.6 kW | 2.93 kW |
| 32A 230V 1Ø | 3 | 17.6 kW | 2.93 kW |
| 30A 208V 1Ø | 3 | 14.7 kW | 2.45 kW |
| 50A 208V 3ØΔ | 1 | 14.4 kW | 2.4 kW |
| 16A 230/400V 3ØY | 1 | 8.8 kW | 1.46 kW |
| 32A 230V 1Ø | 1 | 5.8 kW | 0.96 kW |
| 30A 208V 1Ø | 1 | 4.9 kW | 0.81 kW |

FIG. 7

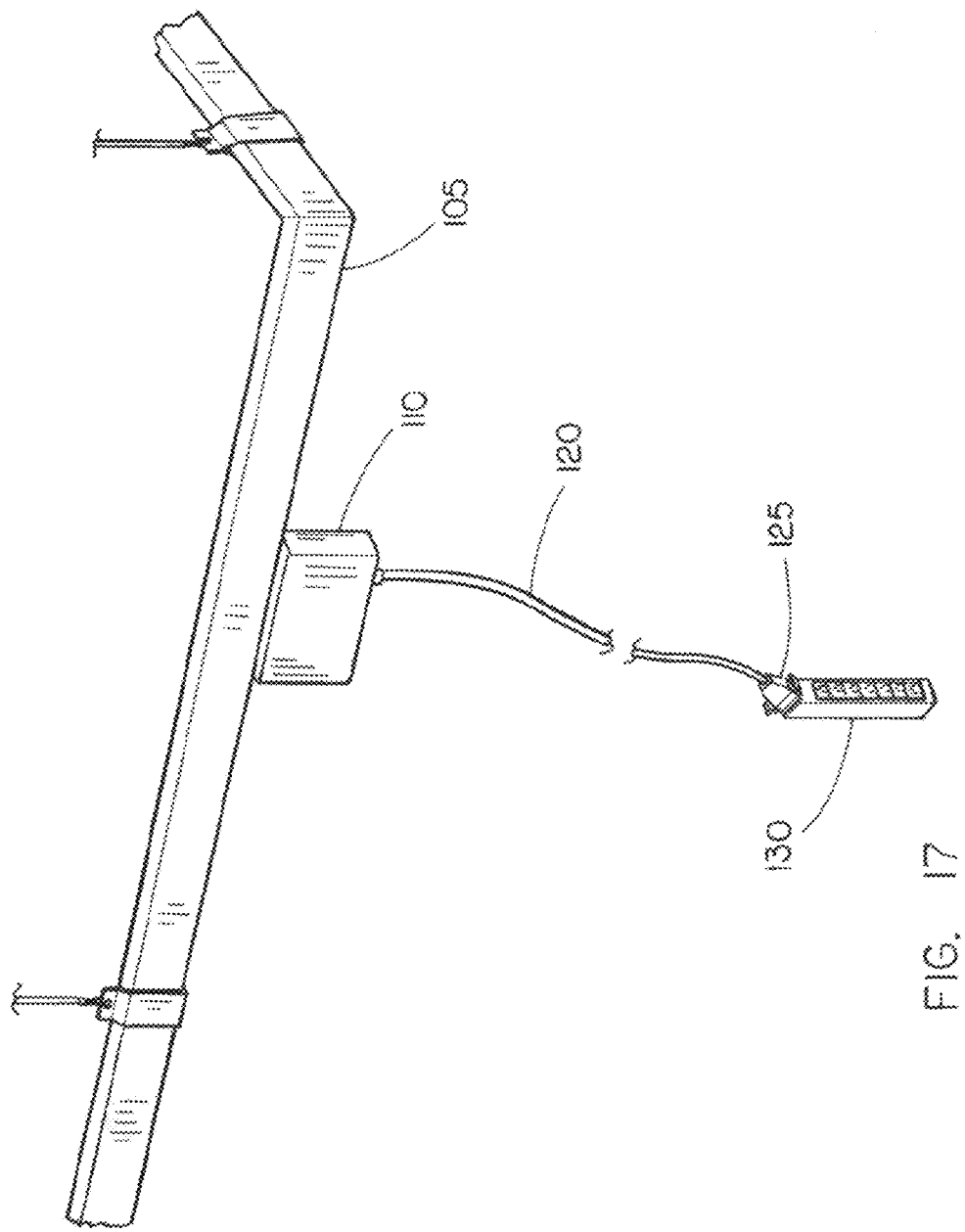

APPARATUS FOR DISTRIBUTING POWER

CROSS REFERENCE TO RELATED APPLICATIONS

The present application claims the benefit under 35 U.S.C. § 119 of U.S. Provisional Patent Application Ser. No. 61/989,083 filed May 6, 2014. The U.S. Provisional Patent Application Ser. No. 61/989,083 filed May 6, 2014 is hereby incorporated by reference in its entirety.

TECHNICAL FIELD

The present disclosure generally relates to the field of distributing power, and more particularly to an apparatus for distributing power.

BACKGROUND

Many electronic devices, particularly computer and data storage equipment, are supplied power from an alternating current (AC) power source. For computer and data storage equipment, a power distribution unit (PDU) is typically employed. A typical power distribution unit is configured for a particular power input and a particular power output. A typical power distribution unit may include one or multiple input power feeds and a set of outlet groups designed to support a particular fixed output. Often, when the computer or data storage equipment has a modification, it may be necessary to change the power distribution unit. However, the modification may or may not require a change in the power supplied to the power distribution unit.

SUMMARY

Accordingly, the present disclosure is directed to an apparatus for distributing power which includes a power configuration device and an outlet power strip. The power configuration device may be coupled to the outlet power strip via a cable that includes a connector device. The apparatus for distributing power may provide that the power configuration device may only be changed when necessary and the outlet power strip may only be changed when necessary, creating a modular power system for computer and data storage equipment which may allow for efficient and cost-effective power distribution modifications.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which:

FIG. 7 depicts a diagram of exemplary host box configurations and input power feeds in accordance with an embodiment of the present disclosure;

FIG. 17 depicts a power configuration device operable with a busway system in accordance with embodiment of the present disclosure.

DETAILED DESCRIPTION

Reference will now be made in detail to the subject matter disclosed, which is illustrated in the accompanying drawings.

Figure 1:
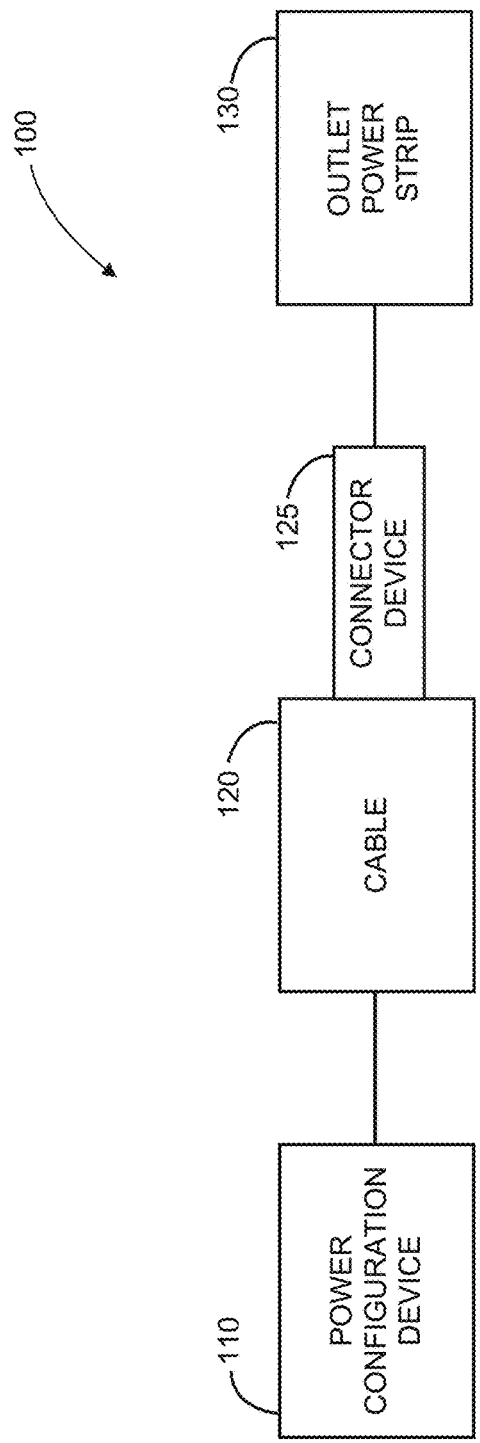
FIG. 1 depicts a block diagram of an apparatus for distributing power in accordance with an embodiment of the present disclosure.

Referring to FIG. 1, a block diagram of an apparatus 100 for distributing power in accordance with an embodiment of the present disclosure is shown. Apparatus 100 may include a power configuration device 110 and an outlet power strip 130. Apparatus 100 may further include a cable 120, the cable 120 including a connector device 125 configured to removably couple the power configuration device 110 with the outlet power strip 130.

Power configuration device 110 is configured to couple with at least one input power feed and may include a host box configuration configured for a particular power characteristic. For example, power configuration device 110 may couple with a single or multiple input power feed. Input power feed may be a single phase or three phase alternating current (AC) input power and may vary in current, such as 16 Amperes to 50 Amperes. Input power feed(s) may include a plug or plugs to connect to the mains supply. Power configuration device 130 may include various host box configurations configured for a particular power characteristic. The particular power characteristic may include single phase power, three phase wye power, or three phase delta power received by the power configuration device 110 and may include a particular current and a particular voltage. Various host box configurations may allow one or more input power feeds and may include zero or one or more circuit breakers. For example, various host box configurations may include zero, one, two or six circuit breakers. However, it is contemplated that the form factor of the power configuration device 110 may remain a fixed size. This may allow replacement of power configuration devices without the need for adjustment or modification of the area surrounding the power configuration device 110.

Outlet power strip 110 may include a set of outlet power groups configured to supply a particular output power characteristic. The particular output characteristic may include a single phase supply at a particular voltage and a particular current, such as 230 Volts and 16-20 Amperes. Each outlet power group may include an electrical outlet and each outlet power strip may include a plurality of outlet power groups. It is further contemplated that each outlet power group may include different types of electrical outlets. For example, the electrical outlets may include C13 receptacles and C19 receptacles. It is contemplated that the wiring of the outlet power strip 110 may allow it to universally connect and operate with various types of input supplies, including single phase, three phase wye and three phase delta power supplies.

Cable 120 may include one or more conductors and may be held together with an overall sheath. Cable 120 may include a connector device 125. In one embodiment, cable 120 may include twelve live conductors and two ground conductors. It is contemplated that cable 120 and connector device 125 may be the same for all the host box configurations depicted in FIGS. 9-16. Connector device 125 is configured to allow connectivity to the twelve live conductors and two ground connectors. Power configuration device 110 or outlet power strip 130 may include a corresponding connector device which may easily connect with connector device 125 to allow easy connection and removal. It is contemplated that connector device 125 may include one or both of male and female connector parts while the corresponding connector device may include corresponding one or both of male and female connector parts. In an alternative embodiment, cable 120 may include a second connector device (not shown) and may connect to power configuration device 110 and outlet power strip 130 via corresponding connector devices associated with each of the power configuration device 110 or outlet power strip 130. In an alternative embodiment, power configuration device 110 may be operatively coupled to the outlet power strip 130 via a hardwired connection, removing the requirement of a cable with a connection device 125.

Power configuration device 110 may include a housing and outlet power strip 130 may include a separate housing, distinct from the housing of the power configuration device. Cable 120 may couple the power configuration device 110 and outlet power strip 130. Because power configuration device 110 and outlet power strip 130 may be separate, modular units and include separate housings, each can be removed and replaced without the requirement of replacing the other unit. This may provide a modular power system for computer and data storage equipment which may allow for efficient and cost-effective power distribution modifications.

Figure 2:
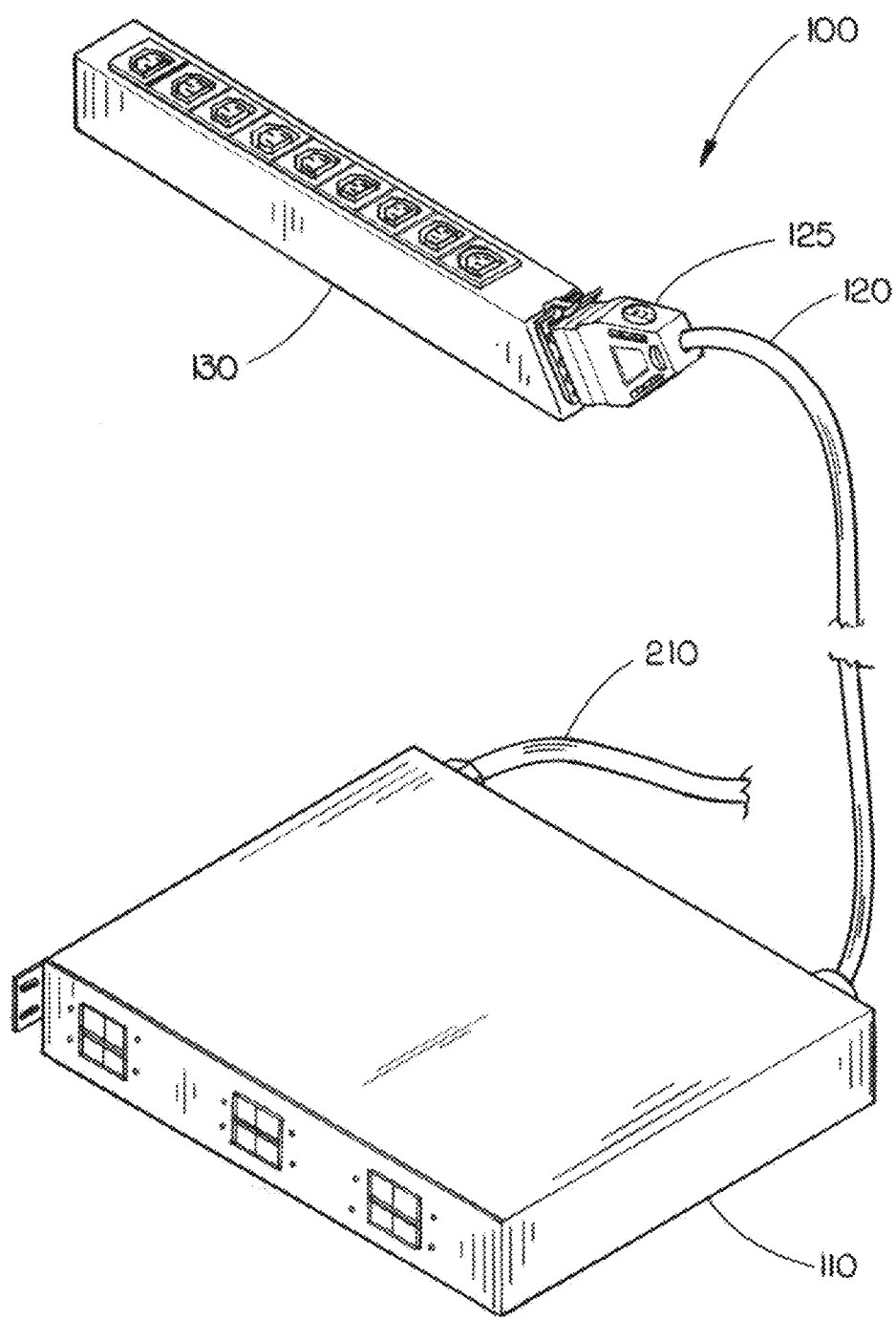
FIG. 2 depicts an exemplary apparatus for distributing power in accordance with an embodiment of the present disclosure.

Referring to FIG. 2, an exemplary apparatus 100 for distributing power in accordance with an embodiment of the present disclosure is shown. Power configuration device 110 may receive input power via an input power feed 210. Power configuration device 110 may be coupled to an outlet power strip 130 via cable 120 and connector device 125. Outlet power strip 130 may include a corresponding connector device which is configured to mate and connect with connector device 125.

Figure 3:
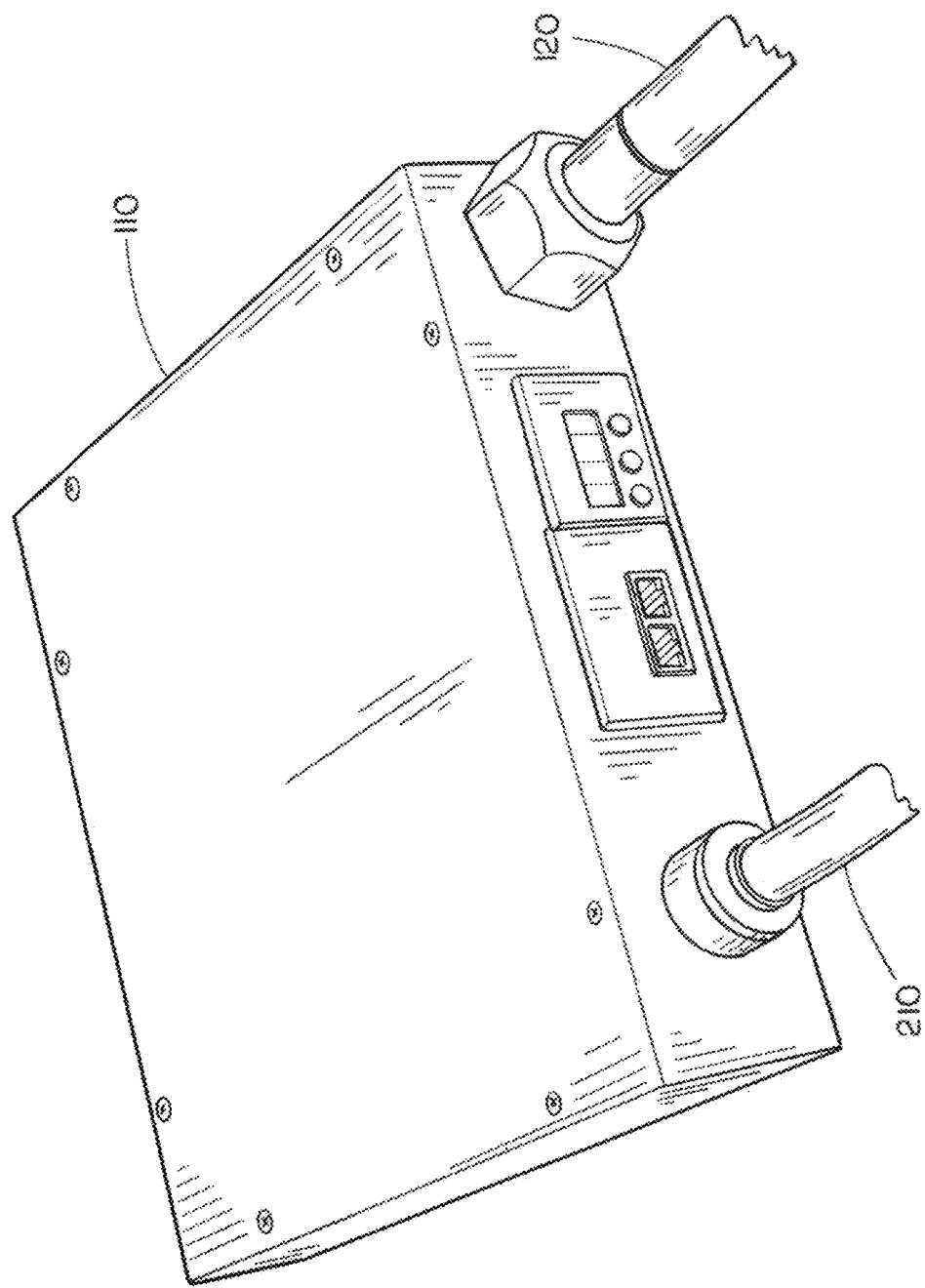
FIG. 3 depicts an exploded view of a power configuration device in accordance with an embodiment of the disclosure.

Referring to FIG. 3, an exploded view of a power configuration device 110 in accordance with an embodiment of the disclosure is shown. Power configuration device 110 may be sized in a similar form factor to house all the various types of host box configurations in order to allow replacement of a power configuration device 110 in a particular area. It is contemplated that connections of cables 120 and 210 to the power configuration device 110 may be implemented through connector devices 125 whereby the power configuration device 110 may further include corresponding connector devices. Additionally, power distribution units may include visual indicators and ports to describe information such as current usage and other power-related information. This information may be presented on a display of the power configuration device 110. It is further contemplated that ports to allow network connectivity and communication with the power configuration device 110 may be included. It is further contemplated that the power configuration device 110 may include a wireless transceiver, such as WI-FI transceiver, to allow communication of power-related information associated with the power configuration device 110 to provide remote monitoring.

Figure 4:
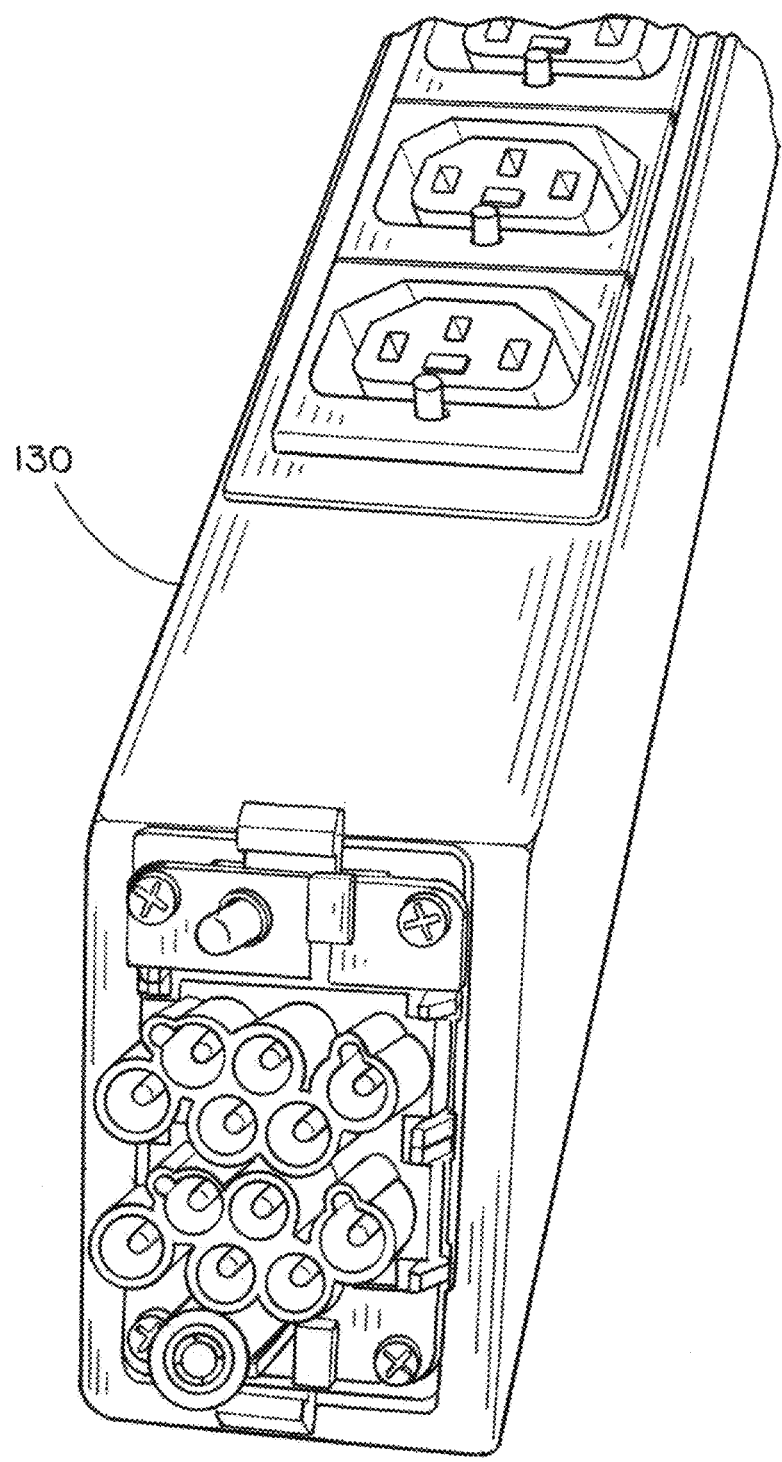
FIG. 4 depicts an exploded view of an outlet power strip in accordance with an embodiment of the present disclosure.

Referring to FIG. 4, an exploded view of an outlet power strip 130 in accordance with an embodiment of the present disclosure is shown. Outlet power strip 130 may include a plurality of electrical outlets, such as receptacles to provide power for electrical equipment. Outlet power strip 130 may be formed as a long, narrow device that may include a corresponding connector device at a top side of the outlet power strip 130. In an embodiment, the placement of a corresponding connector device at a top side of outlet power strip 130 may allow easier connection with cable 120 and connector device 125 which may come from above the outlet power strip 130 in a rack or cabinet environment. Alternatively, outlet power strip 130 may include a hard-wired connection to cable 120 whereby cable 120 and connector device 125 may easily connect with power configuration device 110. It should be understood that the outlet power strip 130 may be formed in a different form factor and location of the corresponding connector device may vary without departing from the scope and intent of the present disclosure.

Figure 5:
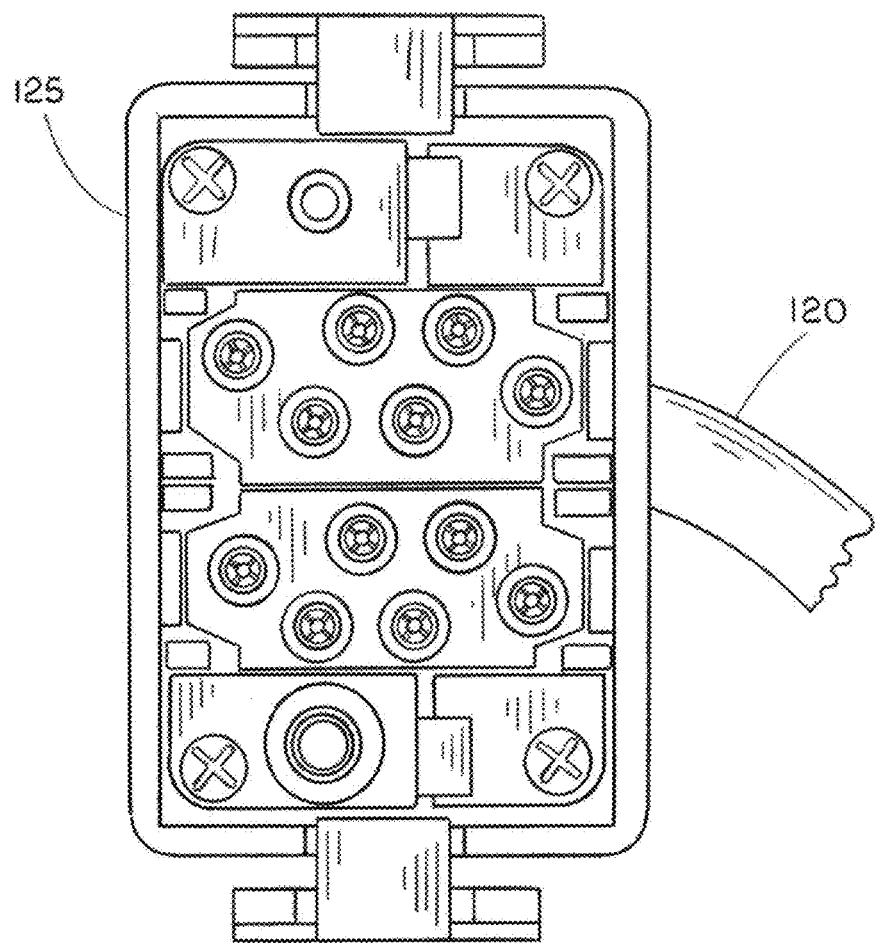
FIG. 5 depicts an exploded view of a connector device in accordance with an embodiment of the present disclosure.
Figure 6:
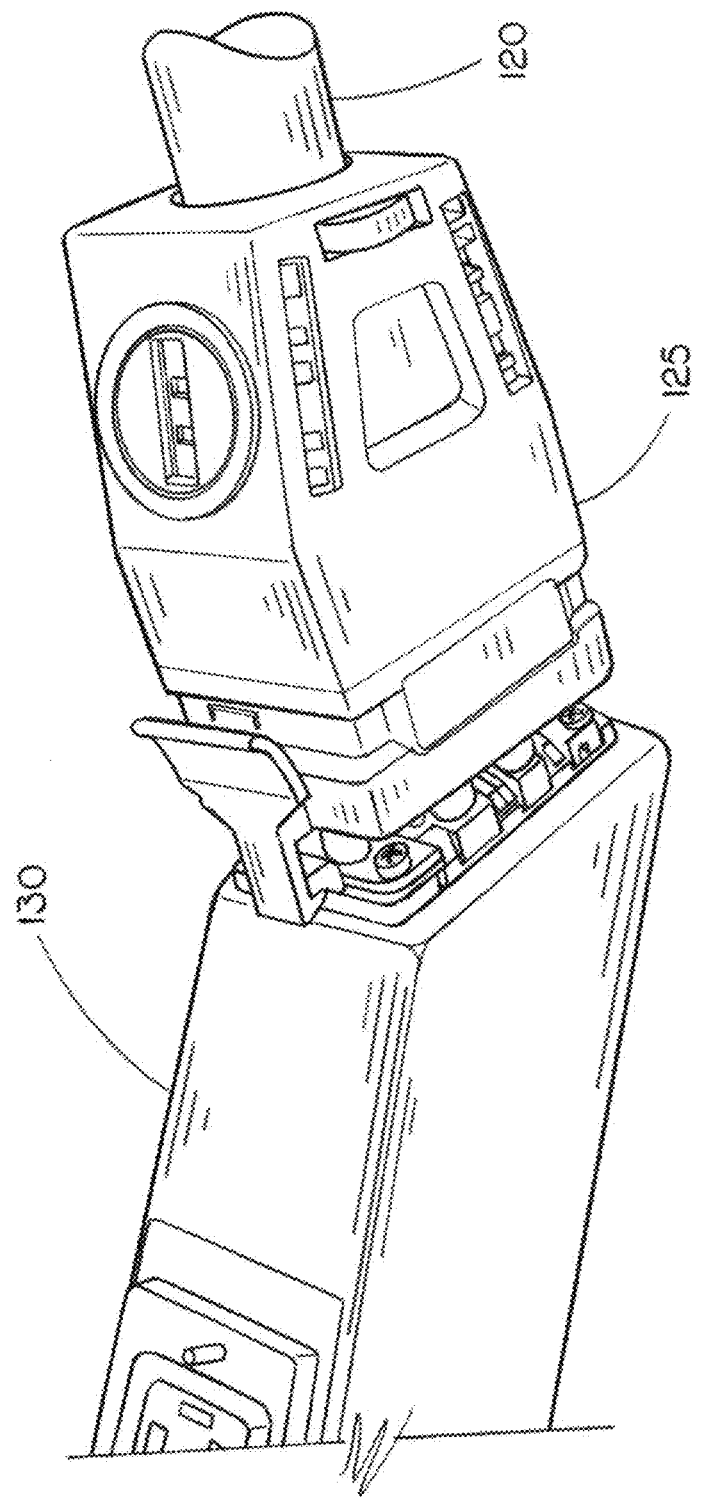
FIG. 6 depicts an exploded view of a connector device coupled with an outlet power strip in accordance with an embodiment of the present disclosure.

Referring to FIG. 5, an exploded view of a connector device 125 in accordance with an embodiment of the present disclosure is shown. Connector device 125 may be a universal connector and may support transfer of power from the various host box configurations of power configuration device 110 to the outlet power strip 130. Referring to FIG. 6, an exploded view of a connector device 125 coupled with a corresponding connector device associated with an outlet power strip 130 in accordance with an embodiment of the present disclosure is shown. It is contemplated that connector device 125 may include one or both of male and female connector parts while the corresponding connector device may include corresponding one or both of male and female connector parts. It should be understood that the views depicted in FIGS. 5 and 6 may only represent embodiments and various types of connector assemblies may be employed without departing from the scope and intent of the present disclosure.

Referring to FIG. 7, a diagram of exemplary host box configurations and input power feeds in accordance with an embodiment of the present disclosure is shown. Diagram also shows exemplary total power available along with the power for each outlet group is shown. It is contemplated that the number of input power feeds may be one, two or three according to various embodiments of the present disclosure to provide single phase power, three phase wye power and three phase delta power. While these host box configurations are described, it is contemplated that additional host box configurations could be employed without departing from the scope and intent of the present disclosure.

Figure 8:
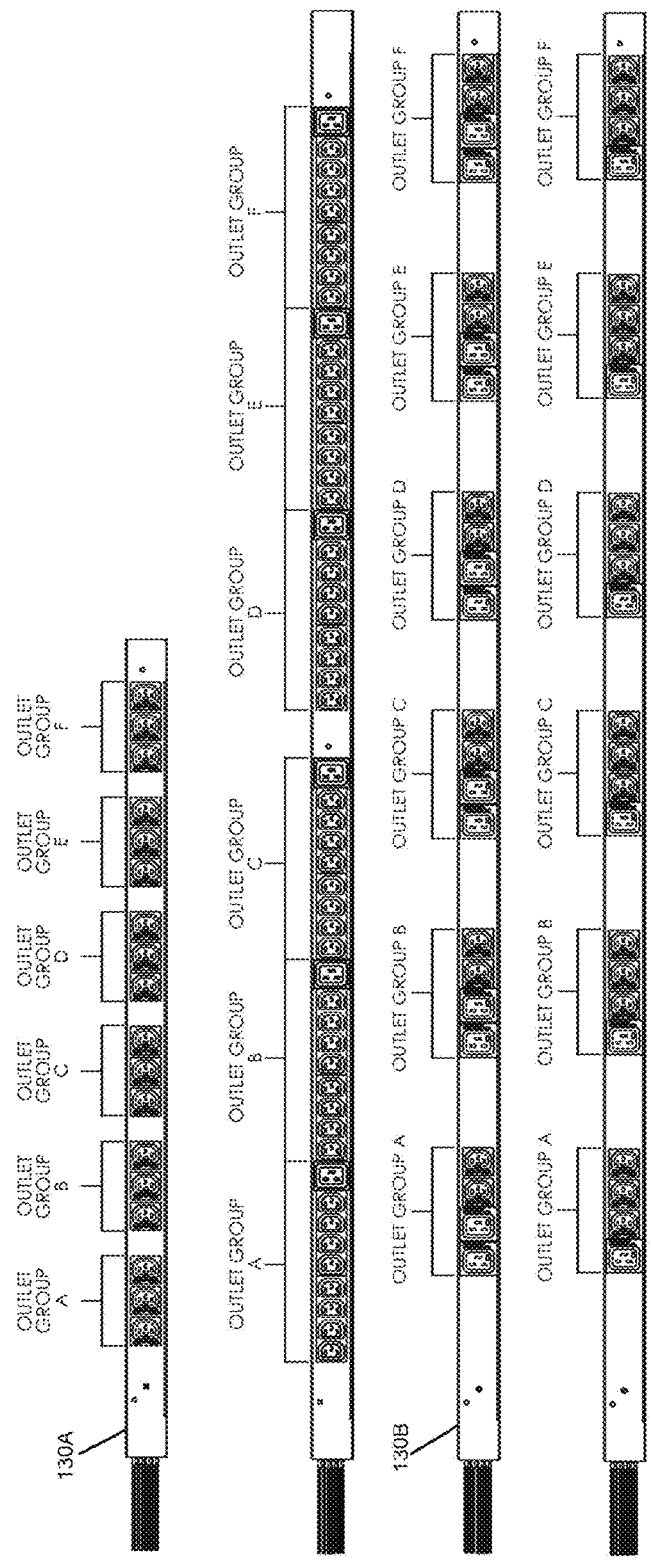
FIG. 8 depicts various outlet power strips in accordance with embodiment of the present disclosure.
Figure 9:
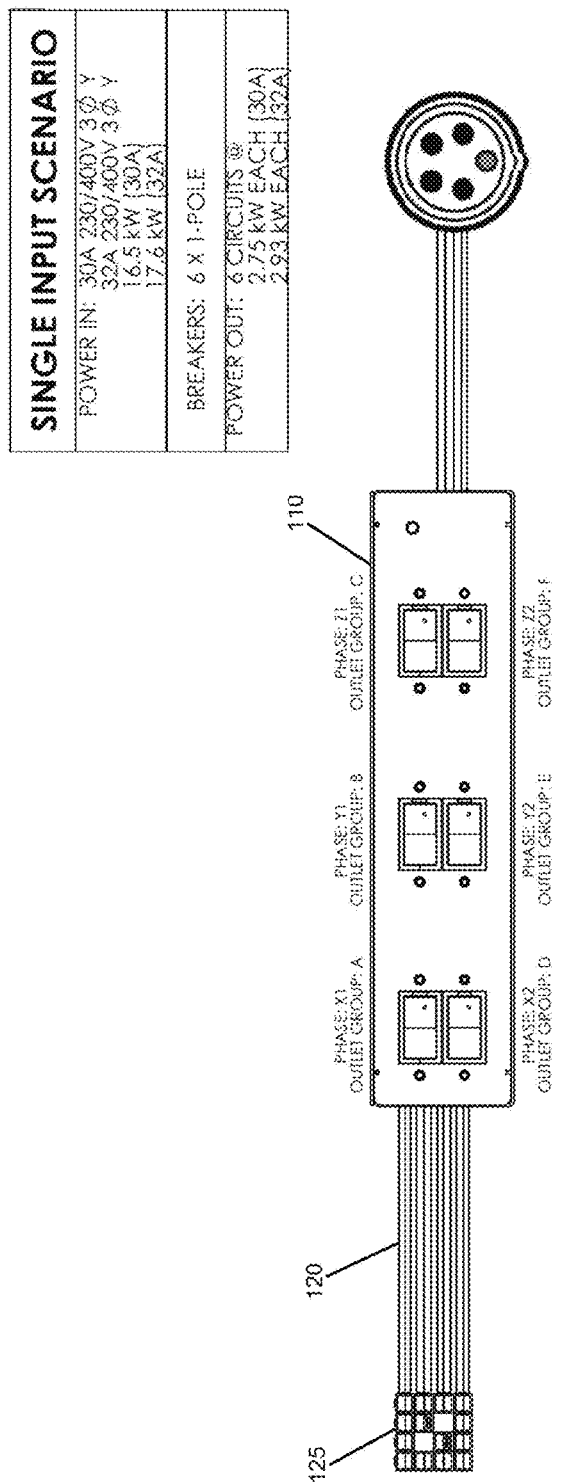
FIGS. 9-16 depict exploded views of the various host box configurations that may be employed in a power configuration device in accordance with an embodiment of the present disclosure.

Referring to FIG. 8, various outlet power strips in accordance with embodiment of the present disclosure are shown. Outlet power strip 130A, 130B may be configured to provide the desired output power, through a plurality of outlet groups, based upon the host box configuration of a power configuration device 110. Advantageously, this may reduce the need to purchase breakers, cables and plugs when IT equipment is modified. Additionally, multiple power feeds may be combined to create higher density power in a cabinet while conserving space, preventing the need for four or six power distribution units. It is contemplated that outlet power strip 130A, 130B may be configured to fit and mount within a rack or cabinet, however, the size and form factor may be adjusted without departing from the scope and intent of the present disclosure.

Figure 10:
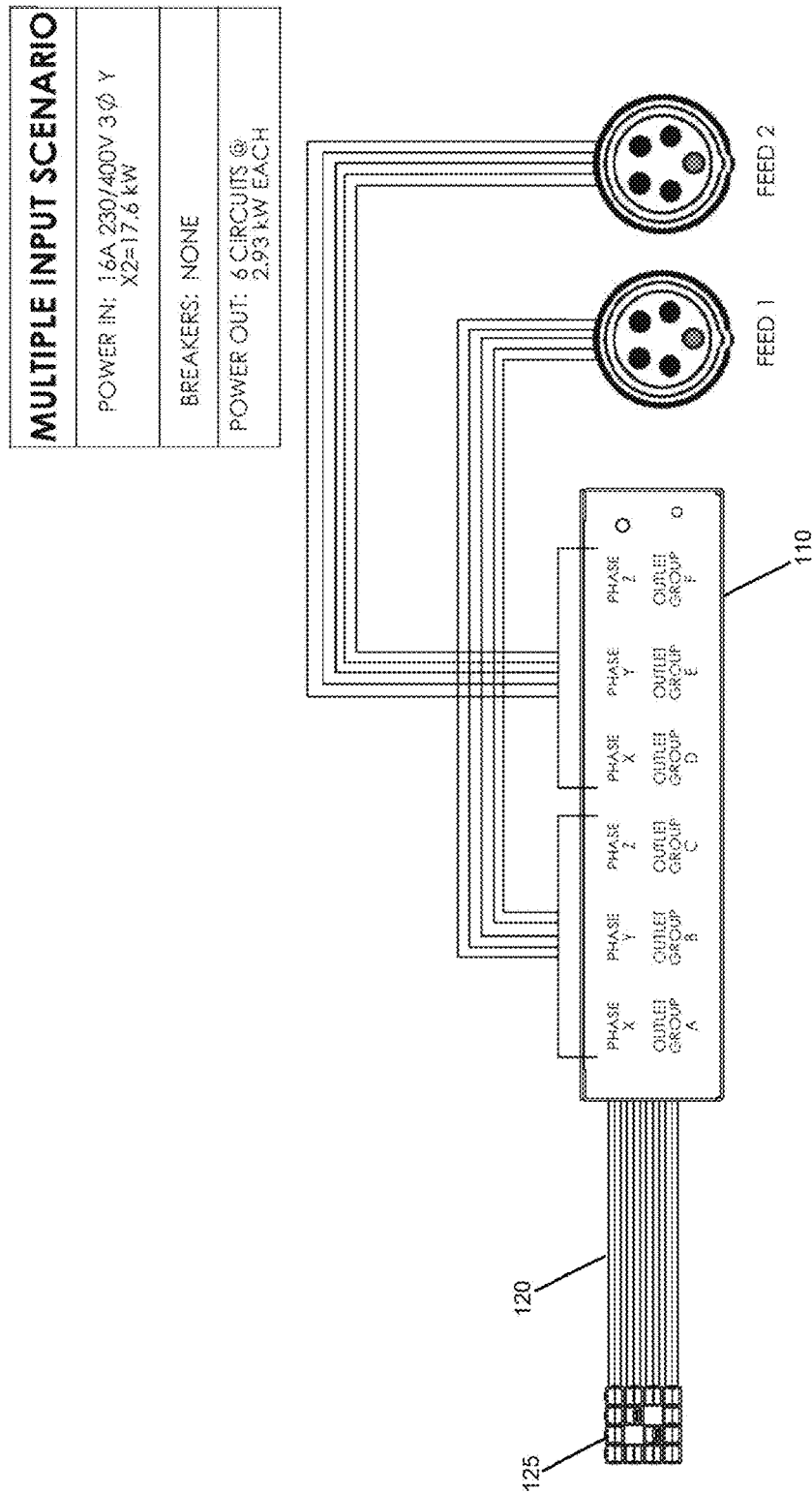
Figure 11:
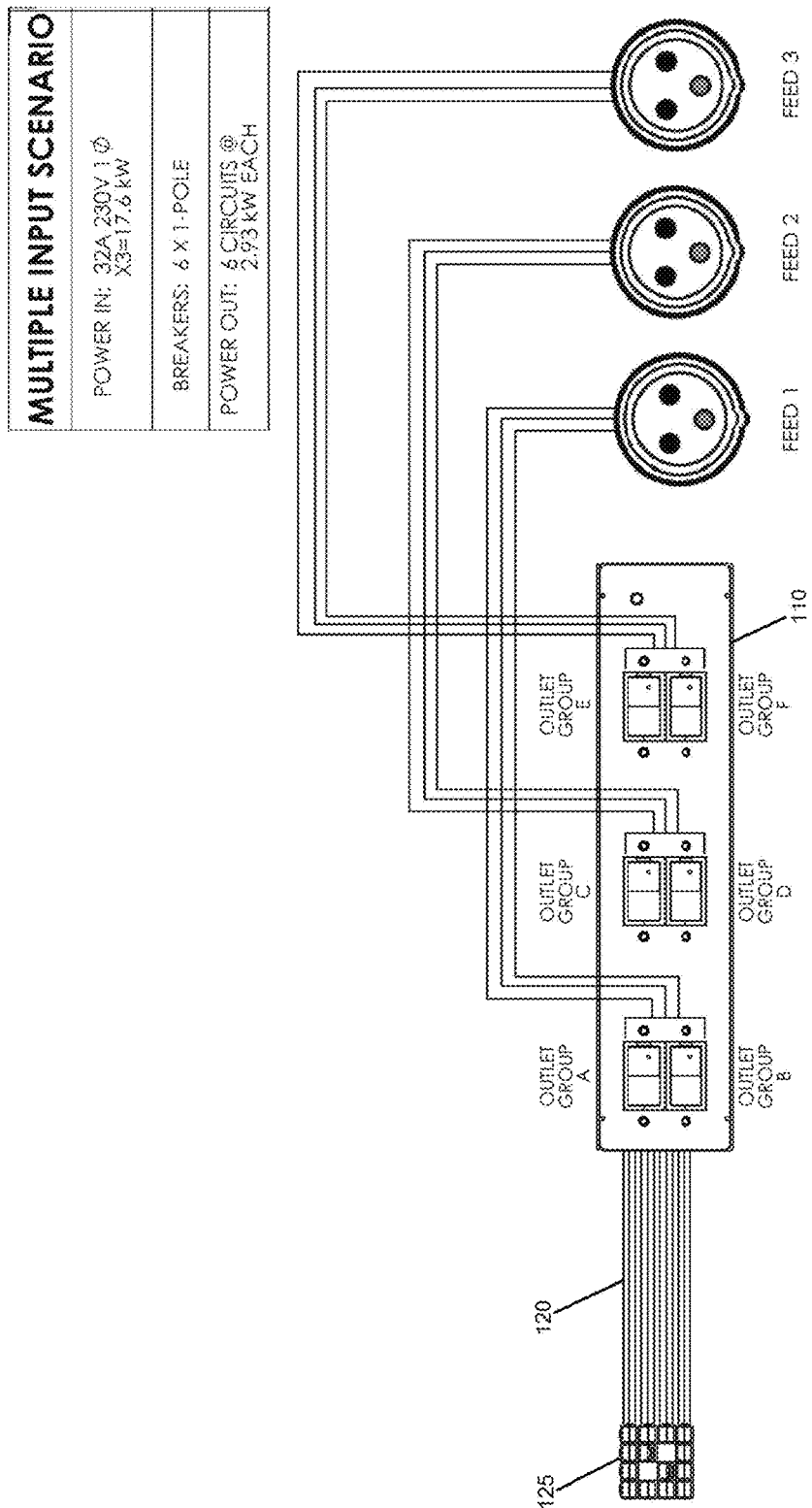
Figure 12:
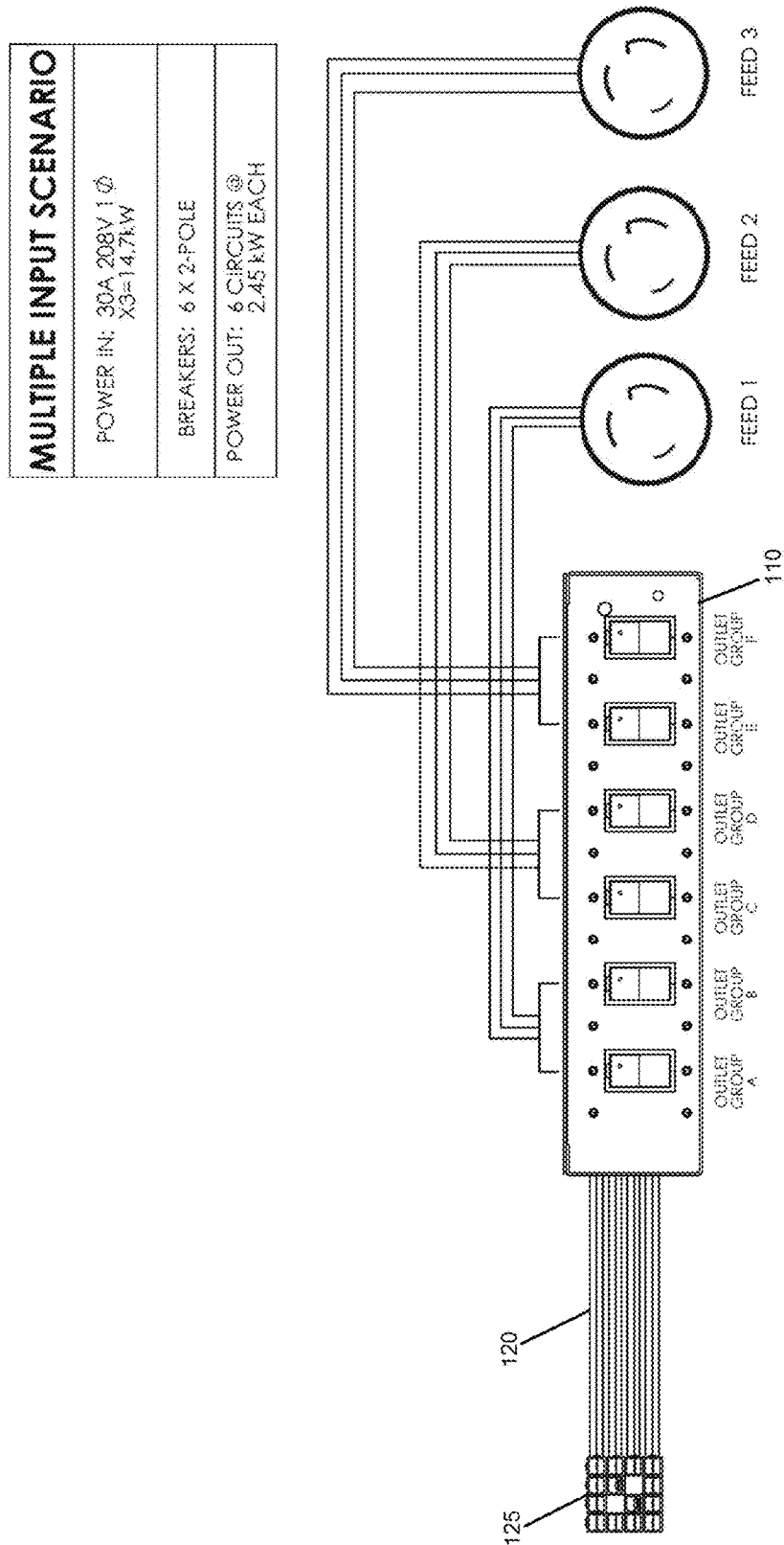
Figure 13:
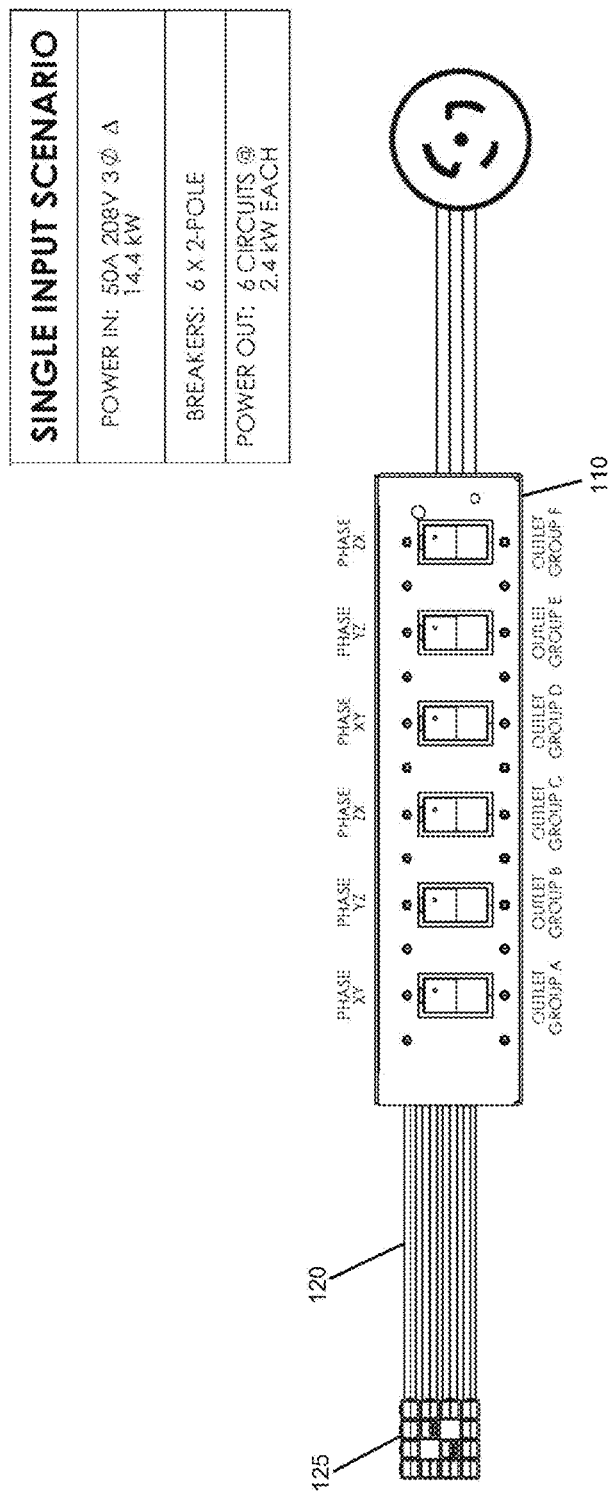
Figure 14:
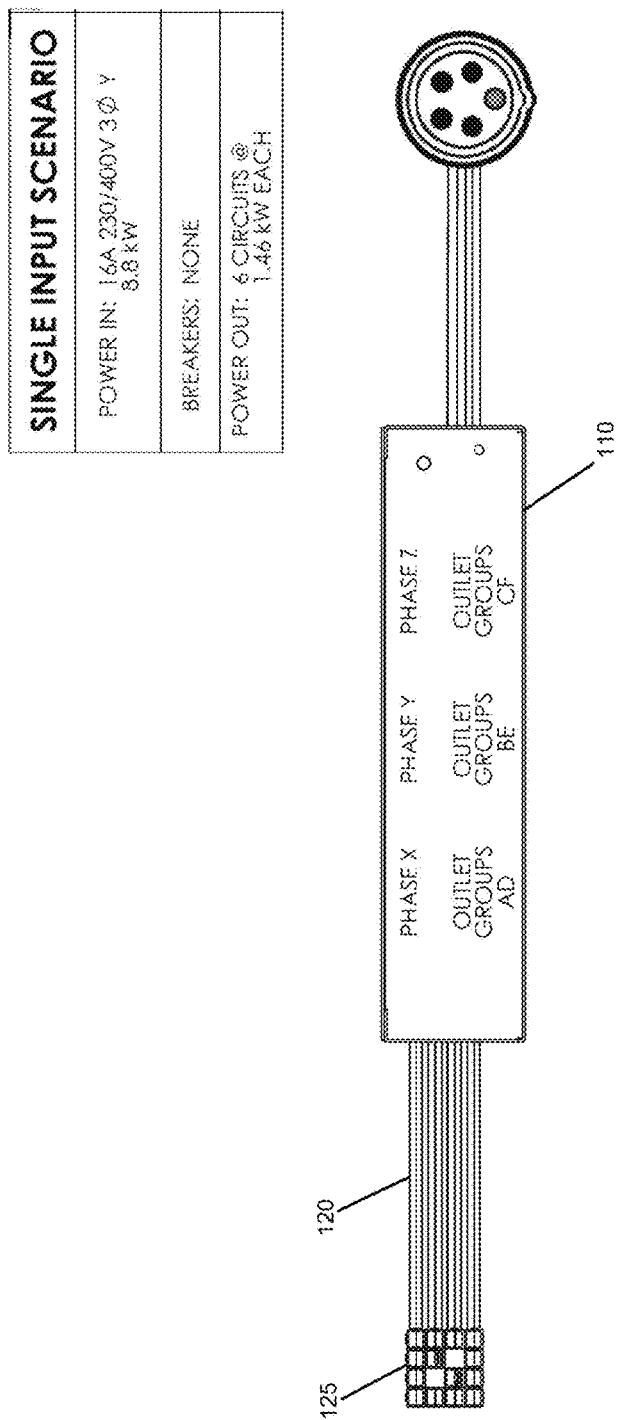
Figure 15:
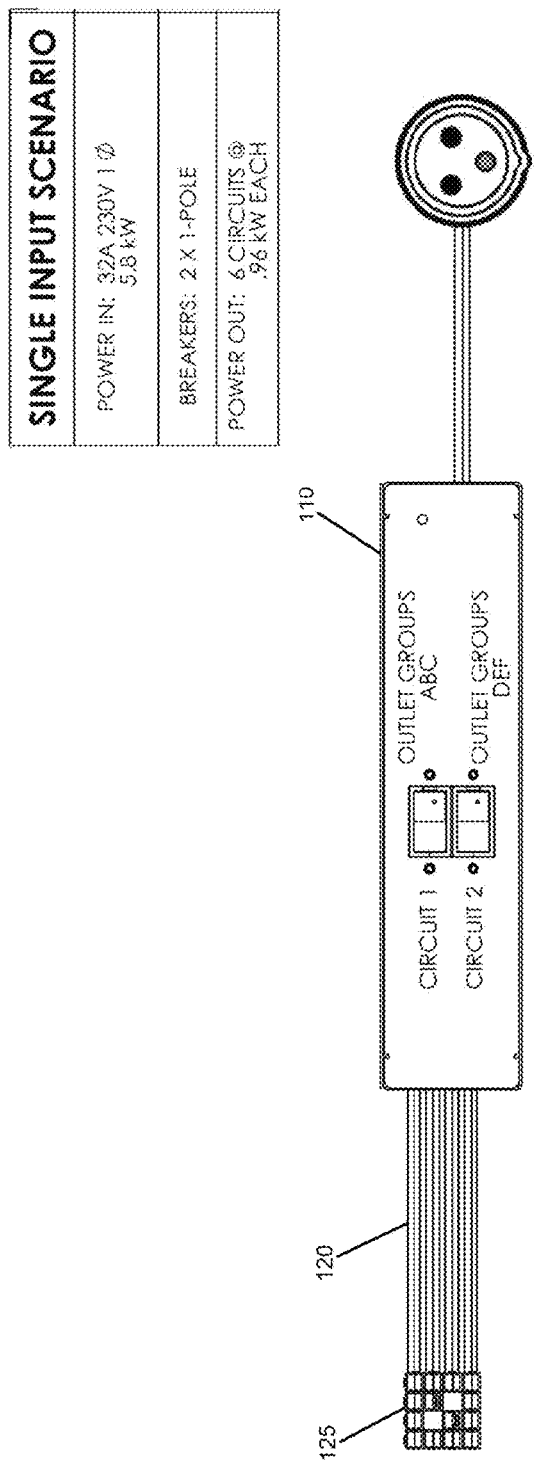
Figure 16:
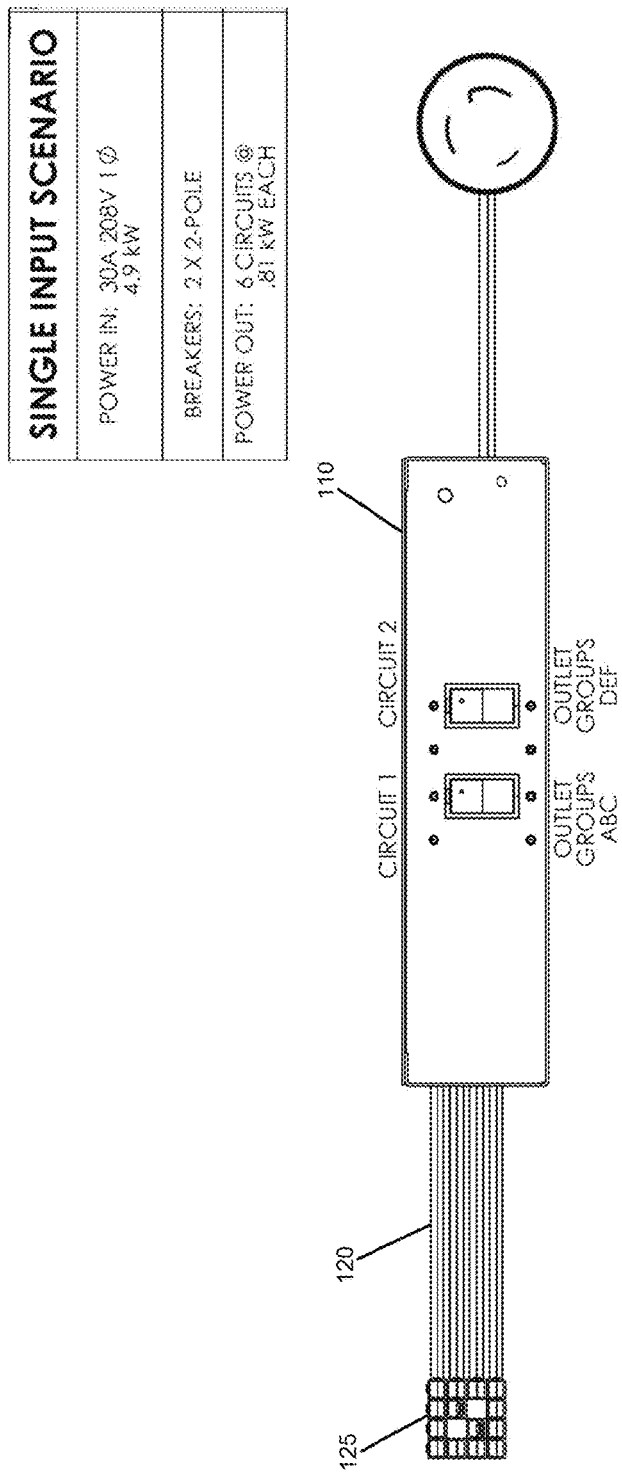

Referring to FIGS. 9-16, exploded views of the various host box configurations employed in the power configuration device 110 in accordance with an embodiment of the present disclosure are shown. Advantageously, a power configuration device 110 may be swapped with a power configuration device 110 with a different host box configuration, such as a host box configuration depicted in FIGS. 9-16. Adjustment of the power configuration device 110 with one including a different host box configuration may allow efficient adjustment of the input power from one or more power feeds to the outlet power strip 130. For example, if the output power was to remain the same, such as 2.93 kW per outlet group but the number of feeds was changed from two input power feeds to three input power feeds, then the power configuration device 110 as depicted in FIG. 10 could be changed with the power configuration device 110 as depicted in FIG. 11. Advantageously, this could occur without any change to the outlet power strip 130, reducing waste and inefficiency. Additionally, the change in the power configuration device 110 could be implemented without the need to modify the outlet power strip 130, the structure supplying the power feeds, or the surrounding area as the form factor of the power configuration device 110 will not have changed.

Additionally, referring once again to FIG. 8, an outlet power strip 130A may be swapped with another outlet power strip 130B if a different output is necessary, for example, a different type of outlet or numbers of different types of outlets. Advantageously, if an IT modification requires a different output power characteristic, such as a type of outlet, the outlet power strip 130 may be swapped. This may be achieved without any change to the power configuration device 110, the cable 120 or cable connector 125. Rather, a new outlet power strip 130B, for example, may replace the old outlet power strip 130A, for example, and may be easily connected to the power configuration device 110 via the cable 120 and cable connector 125.

Referring to FIG. 17, a power configuration device 110 operable with a busway system in accordance with embodiment of the present disclosure is shown. Busway 105 may be configured to support one or more power feeds. It is contemplated that power configuration device 110 may be operable as a busway tap device whereby power configuration device 110 may connect to at least one power feed supported in busway 105 and supply power via cable 120 and connector device 125 to an outlet power strip 130. It is contemplated that power configuration device 110 may include the host box configurations as shown in FIGS. 9-16 and may be removably connectable to the busway 105.

It is contemplated that apparatus 100 for distributing power may be implemented in a variety of alternative embodiments. For example, the exemplary host box configurations (referenced in FIGS. 9-16) depict exemplary voltage, current and power values. In such a fashion, it can be understood the way in which apparatus for distributing power may be employed with a variety of host box configurations. However, it should be understood that the apparatus for distributing power is not limited to just the host box configurations depicted. Rather, other types of host box configurations may be employed, those that include other current, voltage and power values. For example, some of the host box configurations describe a 230 Volt input. It should be understood that there is a range of other voltages that could be employed, such as 110 volts or 240 volts. Other current values and corresponding power values may also be employed without departing from the scope and intent of the present disclosure.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. An apparatus for distributing power, comprising:
a power configuration device, the power configuration device configured to couple with at least one input power feed, the power configuration device including a housing, a first connector device, a display to provide power related information, a wireless transceiver and a host box configuration configured to receive three phase wye power or three phase delta power;
an outlet power strip, wherein the outlet power strip includes another housing, a second connector device and a set of outlet power groups of at least C13 or C19 receptacles configured to supply a particular output power characteristic; and
a cable including a connector device on a first end of the cable and another connector device on a second end of the cable configured to removably couple the power configuration device with the outlet power strip, the cable including twelve live conductors and two ground conductors, wherein the connector device on a first end of the cable is configured to removably connect with the first connector device of the power configuration device and the another connector device on the second end of the cable is configured to removably connect with the second connector device on the outlet power strip.

2. The apparatus of claim 1, wherein the power configuration device is configured as a busway tap device.

3. The apparatus of claim 1, wherein the at least one power feed coupled to the power configuration device provides 16-50 Amperes of current.

4. The apparatus of claim 1, wherein the power configuration device further comprises one or more ports for network connectivity.

5. An apparatus for distributing power, comprising:
a power configuration device, the power configuration device configured to couple with at least one input power feed, the power configuration device including a housing and a display to provide power related information;
an outlet power strip, wherein the outlet power strip includes another housing, a first connector device and a set of outlet power groups of receptacles configured to supply a particular output power characteristic; and
a cable including a connector device on a first end of the cable configured to removably couple the power configuration device with the outlet power strip, the cable including twelve live conductors and two ground conductors, wherein the connector device on a first end of the cable is configured to removably connect with the first connector device of the outlet power strip.

6. The apparatus of claim 5, wherein the at least one power feed coupled to the power configuration device provides 16-50 Amperes of current.

7. The apparatus of claim 5, wherein the power configuration device is configured as a busway tap device.

8. The apparatus of claim 5, wherein the power configuration device further comprises one or more ports for network connectivity.

9. The apparatus of claim 5, wherein the power configuration device further comprises a wireless transceiver.

10. The apparatus of claim 5, wherein the set of outlet power groups includes C13 or C19 receptacles.

11. The apparatus of claim 5, wherein the power configuration device further comprises a second connector device and the cable includes another connector device on the second end of the cable configured to be removably connected with the second connector device of the power configuration device.

12. A method for distributing power through an apparatus which includes a power configuration device including a housing and a host box configuration, an outlet power strip including another housing and a plurality of receptacles, and a cable including a connector device that is configured to removably connect with a corresponding connector on the outlet power strip, comprising the following steps:

determining the outlet power strip fails to include a desired number of a certain type of receptacle;

disconnecting the outlet power strip from the cable through the corresponding connector;

installing a new outlet power strip which includes the desired number of receptacles of the certain type; and connecting the new outlet power strip which includes the desired number of receptacles of the certain type to the connector device of the cable via a corresponding connector device, wherein a change to the new outlet power strip requires no change to the power configuration device or cable.

13. The method of claim 12, wherein the desired number of receptacles of the certain type include C13 or C19 receptacles.

14. The method of claim 12, wherein the power configuration device is configured as a busway tap device.

15. The method of claim 12, wherein the power configuration device further comprises one or more ports for network connectivity.

16. The method of claim 12, wherein the power configuration device further comprises a display to provide power related information.

17. The apparatus of claim 12, wherein the power configuration device further comprises a wireless transceiver.

* * * * *